United States Patent
Muenz et al.

(10) Patent No.: US 11,874,316 B2
(45) Date of Patent: Jan. 16, 2024

(54) GENERATION OF PATTERNS FOR IDENTIFYING FAULTS IN POWER SUPPLY SYSTEMS

(71) Applicant: Siemens Aktiengesellschaft, Munich (DE)

(72) Inventors: Ulrich Muenz, Plainsboro, NJ (US); Dagmar Beyer, Munich (DE); Chris Oliver Heyde, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 826 days.

(21) Appl. No.: 16/481,978

(22) PCT Filed: Jan. 23, 2018

(86) PCT No.: PCT/EP2018/051514
§ 371 (c)(1),
(2) Date: Jul. 30, 2019

(87) PCT Pub. No.: WO2018/141573
PCT Pub. Date: Aug. 9, 2018

(65) Prior Publication Data
US 2020/0003821 A1    Jan. 2, 2020

(30) Foreign Application Priority Data
Jan. 31, 2017 (EP) .................... 17153978

(51) Int. Cl.
| | |
|---|---|
| *G01R 31/08* | (2020.01) |
| *G01R 31/3183* | (2006.01) |
| *G05B 19/042* | (2006.01) |
| *H02J 3/24* | (2006.01) |

(52) U.S. Cl.
CPC ....... *G01R 31/086* (2013.01); *G01R 31/3183* (2013.01); *G05B 19/0428* (2013.01);
(Continued)

(58) Field of Classification Search
CPC ........ G06Q 50/06; H02J 2203/20; H02J 3/24; H02J 3/241; H02J 3/00; G05B 17/02;
(Continued)

(56) References Cited

U.S. PATENT DOCUMENTS

| | | | |
|---|---|---|---|
| 9,746,511 B2 * | 8/2017 | Wang ..................... | G01R 29/18 |
| 2013/0124119 A1 * | 5/2013 | Reynaud ................ | G01R 31/11 |
| | | | 702/59 |

(Continued)

FOREIGN PATENT DOCUMENTS

| | | |
|---|---|---|
| DE | 102004058619 A1 | 6/2006 |
| EP | 1381132 A1 | 1/2004 |
| EP | 2978096 A1 | 1/2016 |

OTHER PUBLICATIONS

PCT International Search Report and Written Opinion of International Searching Authority dated May 8, 2018 corresponding PCT International Application No. PCT/EP2018/051514 filed Jan. 23, 2018.

(Continued)

*Primary Examiner* — Amy He
(74) *Attorney, Agent, or Firm* — Harness, Dickey & Pierce, P.L.C.

(57) ABSTRACT

A method is for the generation of patterns for identifying faults in power supply systems. In this case, values characterizing a state of the power supply system are used for measurable variables specific to the power supply system for various times in a power supply system and values are determined for the variables specific to the power supply system via a model for the power supply system. In this case, the determination via a model is based on known system-specific input variables and unknown system-specific variables, and the unknown system-specific variables are determined in accordance with a fault-free functioning power supply system. Finally, a pattern for identifying faults is (Continued)

generated by forming the difference between the values characterizing the state and the values determined via the model for the various times.

8 Claims, 5 Drawing Sheets

(52) U.S. Cl.
CPC ........ *H02J 3/24* (2013.01); *G05B 2219/2639* (2013.01); *H02J 2203/20* (2020.01)

(58) Field of Classification Search
CPC ........ G05B 19/0428; G05B 2219/2639; G05B 23/0254; G01R 31/086; G01R 31/3183; G01R 31/08; G01R 31/085
See application file for complete search history.

(56) References Cited

U.S. PATENT DOCUMENTS

| | | | |
|---|---|---|---|
| 2015/0378807 A1* | 12/2015 | Ball | G06Q 10/067 714/47.3 |
| 2016/0116522 A1* | 4/2016 | Abido | G01R 31/085 702/59 |
| 2017/0212492 A1 | 7/2017 | Heyde et al. | |
| 2017/0373535 A1* | 12/2017 | Dam | H02J 3/06 |

OTHER PUBLICATIONS

Extended European Search Report (EPA form 1507N) for European Appln. No. EP 17153978.6 dated Jul. 17, 2019.

* cited by examiner

_US 11,874,316 B2_

GENERATION OF PATTERNS FOR IDENTIFYING FAULTS IN POWER SUPPLY SYSTEMS

PRIORITY STATEMENT

This application is the national phase under 35 U.S.C. § 371 of PCT International Application No. PCT/EP2018/051514 which has an International filing date of Jan. 23, 2018, which designated the United States of America and which claims priority to European patent application number EP17153978.6 filed Jan. 31, 2017, the entire contents of which are hereby incorporated herein by reference.

FIELD

Embodiments of the present application generally concern a method and a system for the generation of patterns for identifying faults in power supply systems, a method and a system for identifying faults in power supply systems, and a computer program product.

BACKGROUND

During the operation of a power supply system, it must be ensured that the stability of the power supply system is maintained overall in the event of failure of individual components or equipment. For this purpose monitoring of the power supply system is required. This is usually achieved by way of messages sent to control rooms provided for power supply system control. The messages originate from protective devices or other local measuring equipment. The evaluation of these messages, which arrive independently in the control room, is in many cases carried out manually. The messages contain the results of faults in the power supply system, but possibly not the physical variables themselves. A message would, for example, contain the information that a protective device has tripped on account of a certain setting. If no explicit clarification is possible from such messages, so-called fault records can be read from the field equipment, which contain the physical measurement data at a high resolution. At the present time, this process is also often carried out manually.

New possibilities for monitoring arise from so-called phasor measurement units (PMUs), with which more and more power supply systems are being equipped. In the German literature these PMUs are also called "Zeigermeßgeräte" (pointer measuring equipment) and the data measured by them are called "Zeigerdaten" (pointer data) or "Zeigermeßdaten" (pointer measurement data). With the PMUs, high-resolution and time-synchronous currents and voltages can be measured at various points in power supply systems. PMUs often rely on satellite technology, and allow time-synchronous measurement and monitoring in real time. The data thus obtained are now used, for example, to detect power oscillations and other critical events in the power supply system.

However, it is still very difficult to identify the contingencies for these critical events from the PMU measurements. The reconstruction of the causal faults can be attempted with the aid of modeling of power supply system states.

EP 2978096 A1 proposes a model-based procedure for finding and identifying faults in the power supply system. By modeling power supply system states afflicted with faults, patterns for identifying faults are generated (in what follows, the patterns for identifying faults are also referred to as fault patterns), and measures for ensuring power supply system stability are assigned to these fault patterns. This information is stored in a data memory. If a fault pattern occurs in the power supply system, the pattern can then be compared with the fault patterns present in the data memory. By identification of the appropriate fault pattern in the data memory, the associated fault and the required action are then identified.

SUMMARY

The inventors have discovered that there is a need to improve further such model-based power supply system fault detection on the basis of fault patterns.

At least one embodiment of the invention improves power supply system fault detection on the basis of fault patterns.

Embodiments are directed to a method for the generation of patterns for identifying faults in power supply systems, a method for identifying faults in power supply systems, a system for the generation of patterns for identifying faults in power supply systems, a system for identifying faults in power supply systems and a computer program product.

At least one embodiment of the invention is based on the recognition that fault patterns are usually not only characteristic for the associated fault, but also depend on the nominal (that is to say, fault-free) state of the power supply system, that is to say, they are relatively specific.

Therefore, in accordance with one configuration of the subject matter of at least one embodiment of the invention, a method for the generation of patterns for identifying faults in power supply systems is proposed, in which the influence of nominal power supply system states on the generated fault patterns is largely eliminated. Here the term "power supply system" is to be interpreted broadly. It is to comprise any combination of elements with which electricity is exchanged between the elements for the purpose of supplying power to elements. Examples include, but are not restricted to, power transmission and distribution systems in the high-, medium- and low-voltage ranges. At least one embodiment of the invention is also applicable to all complex technical systems operated with electricity, in which a modeling of the power supply of system components is provided.

In accordance with the configuration of the method of at least one embodiment, the steps described in what follows are executed at various times, and a pattern is thus generated for a time profile after a possible fault. However, this execution does not have to take place at these various times, that is to say, the method comprises both a real-time and an offline generation of patterns. As a first step, values characterizing a state of a power supply system are used in the power supply system as measurable values specific to the power supply system. Here "measurable" refers to the data type. The values themselves can be, but do not have to be, determined by measurement. In accordance with one configuration these can be values obtained by modeling or simulation. In particular the variables themselves can also be variables whose values can be measured as pointer data, that is to say, by pointer measuring equipment. In this context and in what follows, a power supply system is understood to be any power supply system that is intended or suitable for the transmission and distribution of electrical power, in particular high-voltage, medium-voltage and low-voltage distribution systems.

In another configuration of the method, the values for measurable variables specific to the power supply system characterizing a state of the power supply system are given by the corresponding measured values. Values for the variables specific to the power supply system are then determined via the model for a plurality of different models. The determination via a model is based on known system-specific input variables and unknown system-specific variables or states. The unknown system-specific variables are determined in accordance with a fault in the power supply system. A pattern for identifying faults is generated by forming the differences between the values characterizing the state of the power supply system and the values determined by way of a model for the various times. A pattern can then be identified from the patterns generated for the plurality of models, in accordance with the minimum of a measure for the absolute magnitude of values of the pattern related to the plurality (e.g. where applicable, the weighted addition of the amounts of values of the pattern over a specified range), and the associated fault can be deduced from the identified pattern.

At least one embodiment of the invention also comprises a method for identifying faults in power supply systems. For this purpose, measured values for variables specific to the power supply system are used for various times in a power supply system, and values for the variables specific to the power supply system are determined via a model for the power supply system. The model is preferably the same model or observer that is used for the inventive method for the generation of patterns for identifying faults in power supply systems. The determination via a model is based on known system-specific input variables and unknown system-specific variables or states, wherein the values of the unknown system-specific variables are determined in accordance with a fault-free functioning power supply system. A pattern for identifying faults is generated by forming the differences between the measured values and the values determined via a model for the various times. Finally, the pattern is compared with patterns stored in a database, generated in accordance with an inventive method, and assigned to faults (typically a 1:1 assignment). The comparison identifies the fault assigned to the pattern (possibly including the measure to be undertaken for the fault).

At least one embodiment of the invention also comprises a database with patterns generated by an inventive method and assigned to faults, together with systems and a computer program product for the execution of the inventive methods. The database and the systems can be designed on the basis of conventional hardware, for example, computing or storage media.

BRIEF DESCRIPTION OF THE DRAWINGS

In what follows the invention is described in more detail in the context of examples of embodiment with the aid of figures. Here.

DETAILED DESCRIPTION OF THE EXAMPLE EMBODIMENTS

Figure 1:
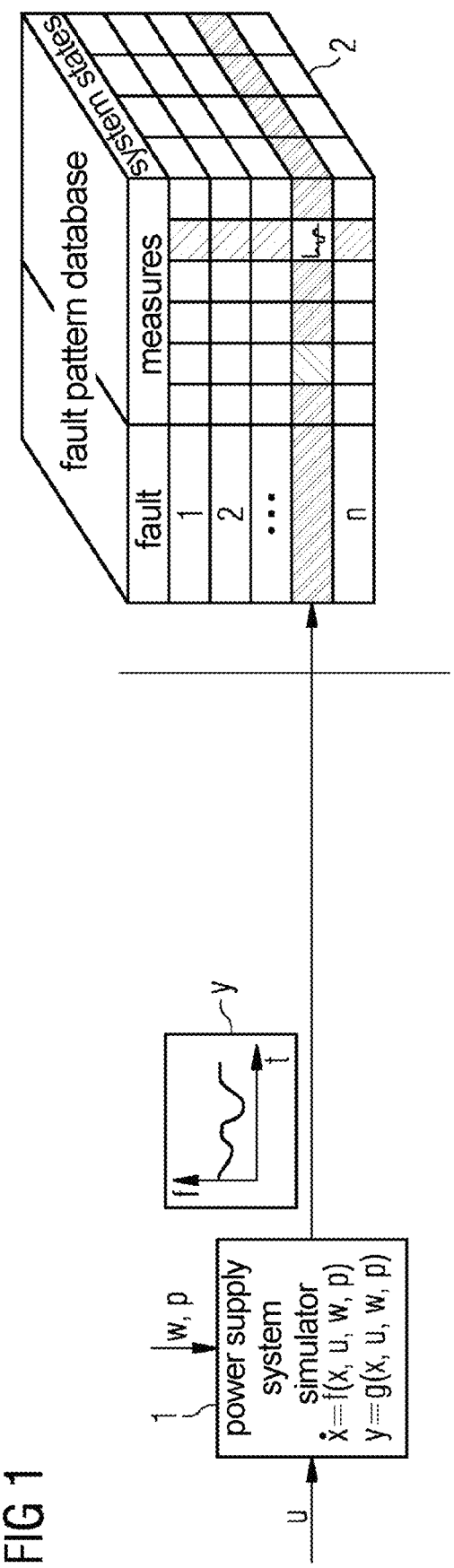
FIG. 1: shows a system for the simulation-based generation of fault patterns.

Therefore, in accordance with one configuration of the subject matter of at least one embodiment of the invention, a method for the generation of patterns for identifying faults in power supply systems is proposed, in which the influence of nominal power supply system states on the generated fault patterns is largely eliminated. Here the term "power supply system" is to be interpreted broadly. It is to comprise any combination of elements with which electricity is exchanged between the elements for the purpose of supplying power to elements. Examples include, but are not restricted to, power transmission and distribution systems in the high-, medium- and low-voltage ranges. At least one embodiment of the invention is also applicable to all complex technical systems operated with electricity, in which a modeling of the power supply of system components is provided.

In accordance with the configuration of the method of at least one embodiment, the steps described in what follows are executed at various times, and a pattern is thus generated for a time profile after a possible fault. However, this execution does not have to take place at these various times, that is to say, the method comprises both a real-time and an offline generation of patterns. As a first step, values characterizing a state of a power supply system are used in the power supply system as measurable values specific to the power supply system. Here "measurable" refers to the data type. The values themselves can be, but do not have to be, determined by measurement. In accordance with one configuration these can be values obtained by modeling or simulation. In particular the variables themselves can also be variables whose values can be measured as pointer data, that is to say, by pointer measuring equipment. In this context and in what follows, a power supply system is understood to be any power supply system that is intended or suitable for the transmission and distribution of electrical power, in particular high-voltage, medium-voltage and low-voltage distribution systems.

In a further step, values for the data specific to the power supply system are determined by way of a simulation or a model for the power supply system. This determination can be made, for example, by way of an "observer" in the context of control technology, that is to say, via a system that determines values of non-measurable variables from the values of known input data and output data of an observed reference system. Here the determination via the model is based on known system-specific input variables and unknown system-specific variables or states. The known system-specific input variables can, for example, include the measurable variables specific to the power supply system as mentioned above. The values of the unknown system-specific variables are determined in accordance with a fault-free functioning power supply system (that is to say, the nominal state or nominal behavior of the power supply system). The model can be controlled by suitable feedback of the known system-specific variables, so that the state of the model corresponds as accurately as possible to the state of the power supply system (for example, can represent, as described above, an observer in the context of control technology), wherein, however, the constraint of the assumption of the fault-free or nominal functioning of the power supply system applies.

The generation of a pattern for identifying faults is then carried out by forming the differences between the values characterizing the state of the power supply system and the values determined via a model for the various times.

The patterns generated in this way are largely independent, or at least are more independent, of the nominal state of the power supply system. That is to say, for a particular fault, identical, or at least similar, patterns are obtained for different nominal power supply system states. This is advantageous for analyses, because a better transferability of modeling results is achieved, as is a reduction of complexity (on account of the smaller number of fault pattern types).

In accordance with one configuration of the method, values for the measurable variables specific to the power supply system are determined by way of simulation. In this case, a system for purposes of simulating states of the power supply system is provided for various states of the power supply system corresponding to faults. This system is used to determine the values for the measurable variables specific to the power supply system that characterize the respective state of the power supply system. By way of these values, the patterns for identifying the respective faults are then generated. In this manner patterns are obtained that correspond to simulated faults, that is to say, an association between patterns and faults is achieved. This assignment of patterns for identifying faults (that is to say, fault patterns) to faults can be stored in a database. Here the assignment can also be of an indirect nature. For example, an assignment of patterns for identifying faults to measures against the associated faults can take place, and can be stored in a database, that is to say, the respective fault is indexed in terms of the countermeasure or countermeasures.

In another configuration of the method, the values for measurable variables specific to the power supply system characterizing a state of the power supply system are given by the corresponding measured values. Values for the variables specific to the power supply system are then determined via the model for a plurality of different models. The determination via a model is based on known system-specific input variables and unknown system-specific variables or states. The unknown system-specific variables are determined in accordance with a fault in the power supply system. A pattern for identifying faults is generated by forming the differences between the values characterizing the state of the power supply system and the values determined by way of a model for the various times. A pattern can then be identified from the patterns generated for the plurality of models, in accordance with the minimum of a measure for the absolute magnitude of values of the pattern related to the plurality (e.g. where applicable, the weighted addition of the amounts of values of the pattern over a specified range), and the associated fault can be deduced from the identified pattern.

At least one embodiment of the invention also comprises a method for identifying faults in power supply systems. For this purpose, measured values for variables specific to the power supply system are used for various times in a power supply system, and values for the variables specific to the power supply system are determined via a model for the power supply system. The model is preferably the same model or observer that is used for the inventive method for the generation of patterns for identifying faults in power supply systems. The determination via a model is based on known system-specific input variables and unknown system-specific variables or states, wherein the values of the unknown system-specific variables are determined in accordance with a fault-free functioning power supply system. A pattern for identifying faults is generated by forming the differences between the measured values and the values determined via a model for the various times. Finally, the pattern is compared with patterns stored in a database, generated in accordance with an inventive method, and assigned to faults (typically a 1:1 assignment). The comparison identifies the fault assigned to the pattern (possibly including the measure to be undertaken for the fault).

At least one embodiment of the invention also comprises a database with patterns generated by an inventive method and assigned to faults, together with systems and a computer program product for the execution of the inventive methods. The database and the systems can be designed on the basis of conventional hardware, for example, computing or storage media.

Figure 2:
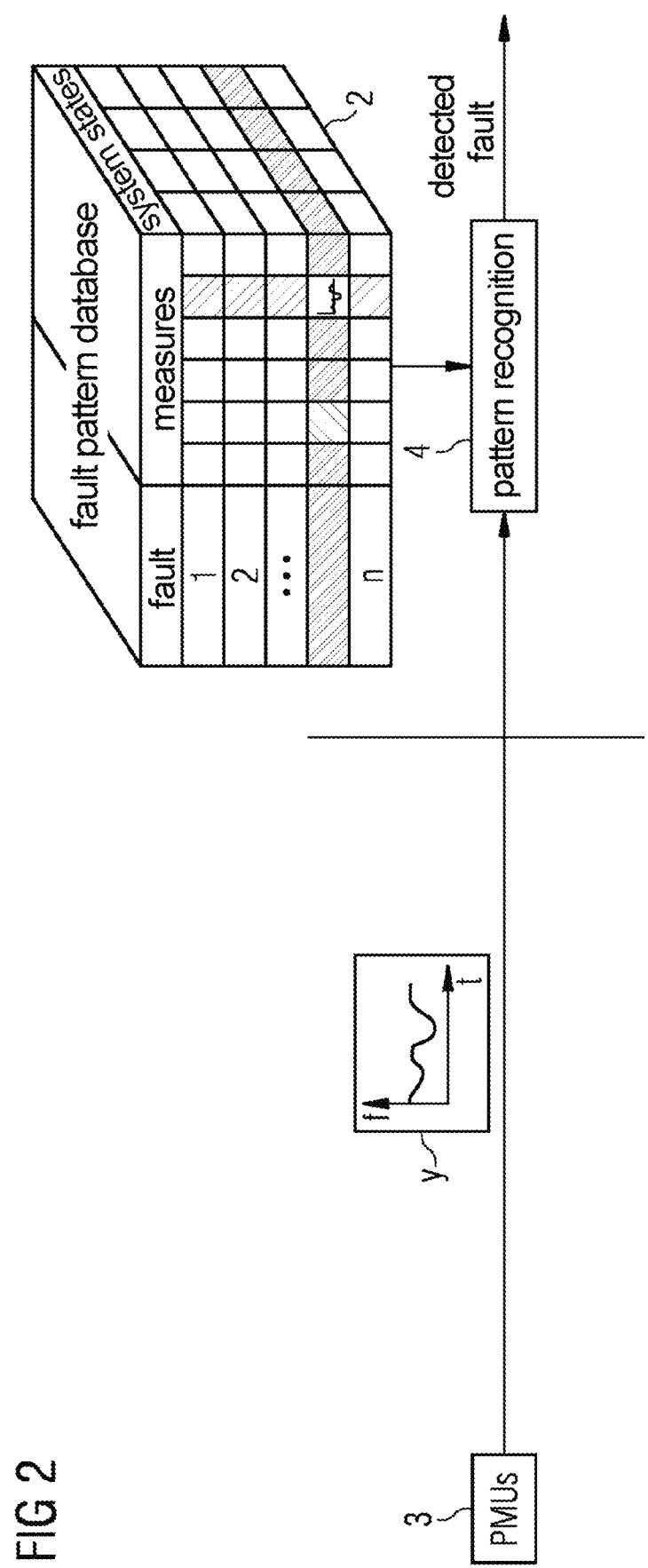
FIG. 2: shows fault identification based on fault patterns.

One possibility for the simulation-based identification of faults is presented in what follows with the aid of FIG. 1 and FIG. 2. FIG. 1 shows a system 1 for the simulation of states of a power supply system (hereinafter: a power supply system simulator). The following variables play a role in the simulation:

| | Role | Examples |
|---|---|---|
| u | Known input | Reference power for high voltage direct current (HVDC) |
| w, p | Uncertain input and uncertain parameters | Power supply via solar or wind power plant, availability of power line |
| x | System states | Frequency of generator i |
| y | Measurable output | PMU measurements |

The procedure consists of two essential steps:

1. Firstly, the state of the power supply system is determined during the run time of the power supply system (for example, every 15 minutes), and on this basis various faults are simulated with the aid of the power supply system simulator 1. FIG. 1 shows a simulated fault pattern y. Ideally, possible countermeasures are also simulated at the same time, and evaluated so as to determine whether these countermeasures help to reduce the impact of the fault. During this simulation, fault patterns y are recorded, which correspond to the PMU measured values of the real system for such a fault. These fault patterns are stored in a fault pattern database 2, which sorts these fault patterns in accordance with the current system state, the contingency, and the countermeasure.

2. The second essential step is described with the aid of FIG. 2. If, during operation, the start of critical behavior, for example, a power swing, is detected, the measured PMU values, or more particularly, the corresponding fault pattern y, are compared with the fault patterns simulated in advance for the current power supply system state. Various data-based approaches can be used for this pattern recognition 4. In this way, the cause of the fault can ideally be identified and appropriate countermeasures can be proposed.

Figure 3:
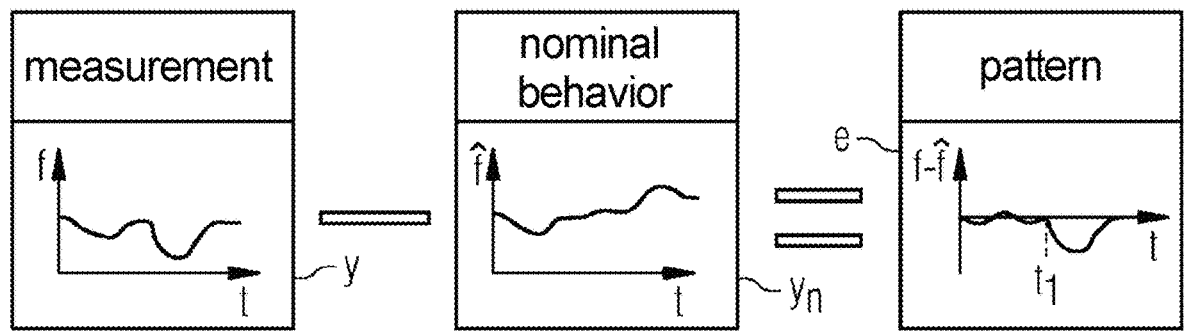
FIG. 3: shows the dependence of fault patterns on the nominal power supply system state.

A starting point for an embodiment of an inventive procedure is the recognition that the fault patterns y used or measured depend on the nominal power supply system state. In accordance with the invention, the number that can be traced back to the nominal behavior of the power supply system is greatly reduced. This is illustrated in FIG. 3. A pattern yn corresponding to the nominal state is subtracted from the measured fault pattern y, resulting in a fault pattern e, which is no longer characteristic for the superposition of nominal behavior and fault behavior, but only for the fault behavior. As can clearly be seen from the pattern e, the actual behavior initially corresponds to the nominal behavior. From time t1, a malfunction begins to occur, which manifests itself in a deflection of the curve.

Figure 4:
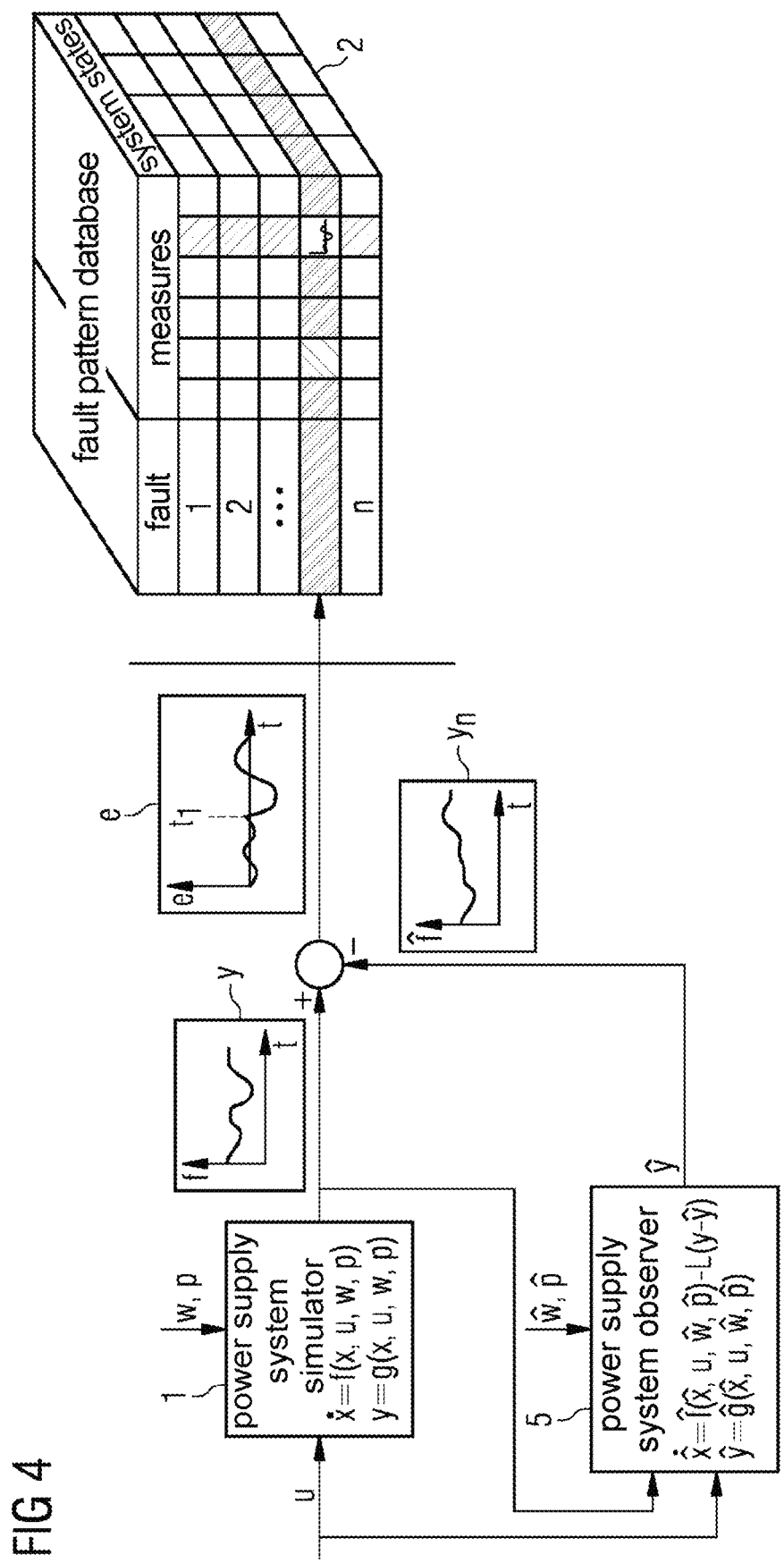
FIG. 4: shows the generation of an embodiment of inventive fault patterns.

For purposes of implementing an embodiment of an inventive elimination of the nominal power supply system state, the method described in FIG. 1 and FIG. 2 is, for example, supplemented by an observer 5. This is illustrated in what follows with the aid of FIG. 4 and FIG. 5. The following variables play a role in FIG. 4 and FIG. 5:

| | Role | Examples |
|---|---|---|
| u | Known input | Transmission power for high voltage direct current (HVDC) |
| w, p | Uncertain input and uncertain parameters | Power supply via solar or wind power plant, availability of power line |
| x | System states | Frequency of generator i |
| y | Measurable output | PMU measurements |
| ŵ, p̂ | Estimates of w, p | Last known values for power supply by solar or wind power plant |
| e | Observer fault = observer-based fault pattern | |
| L | Observer gain, reduces e to zero in the fault-free state | |

In a first step, fault patterns are generated and stored. Here the observer 5 possesses a model of the power supply system, which does not necessarily have to agree with the model of the power supply system simulator 1. For example, it can take the form of a linear model, which corresponds to the power supply system model of the power supply system simulator relinearized at the current operating point. The observer model can be linearized, for example, every 15 minutes around the current operating point. In addition, the observer has the correction term $L(y-\hat{y})$ known from the literature, which always allows the observer fault $x-\hat{x}$ to be very small in the fault-free case (for example, the Luenberger observer familiar from control technology). Thus, in fault-free operation, the deviation between the simulated PMU measured values y and the observer output $\hat{y}$ is approximately zero, as can also be seen from the pattern e in FIG. 4.

A fault is modeled in the power supply system simulator 1 by changing an input variable w or a parameter p of the simulation model during the simulation. Examples are given in the table above. In the observer 5, however, these input variables and parameters are not altered during the simulation of the fault. Therefore, after the fault, the models of the power supply system simulator 1 and the observer 5 no longer match, and thus the simulated PMU values y and the corresponding values of the observer $\hat{y}$ also differ from each other. The resulting fault signal $e=y-\hat{y}$ is approximately zero before the fault and deviates significantly from zero after the fault, see FIG. 4. In contrast to the method described in FIG. 1 and FIG. 2, the fault pattern e is stored in the fault pattern database 2 instead of y.

Figure 5:
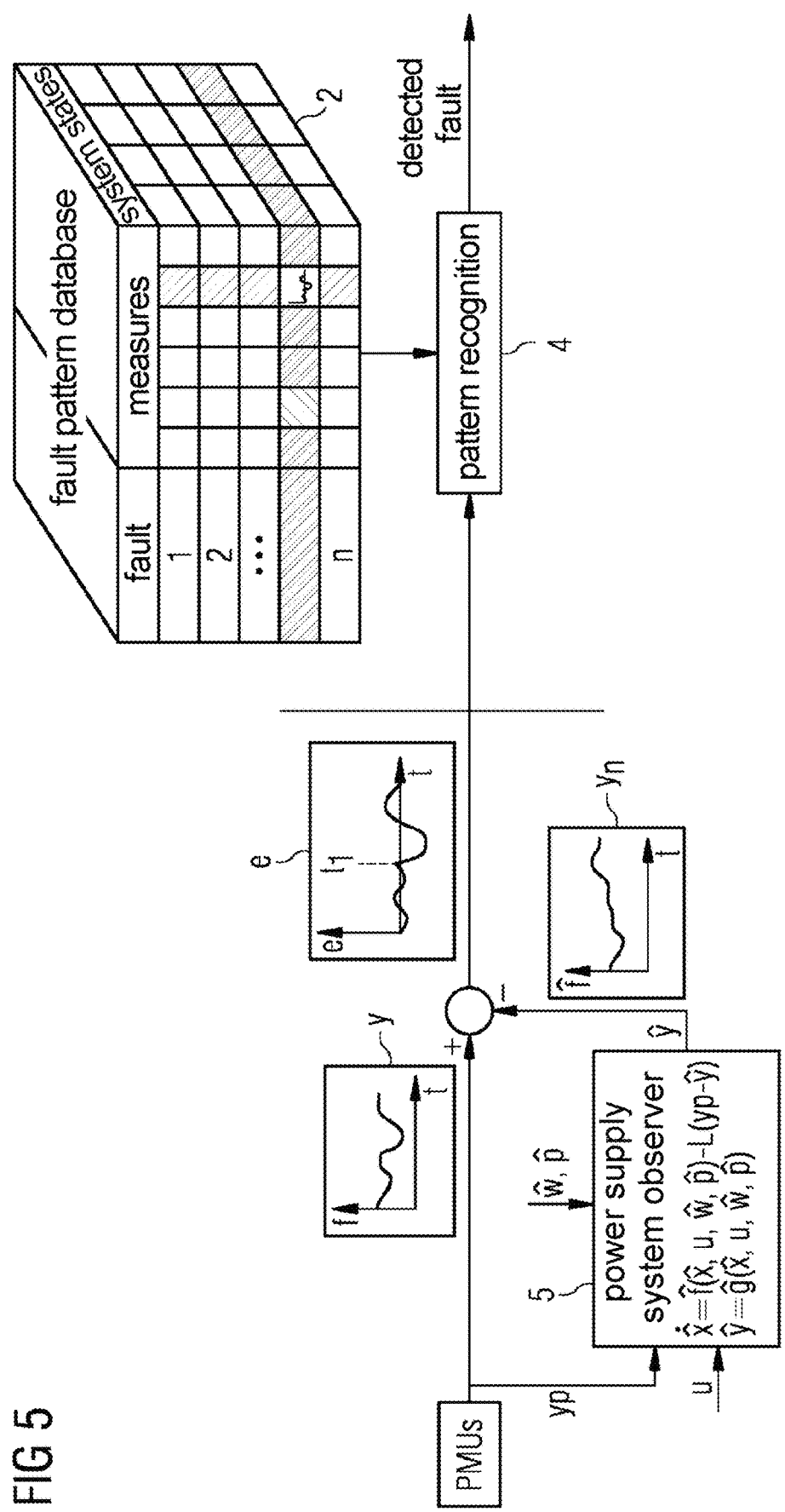
FIG. 5: shows fault identification on the basis of an embodiment of inventive fault patterns.

The reaction to faults now takes place in a second step, as shown in what follows with the aid of FIG. 5. In order to identify faults during operation, the observer 5 runs continuously during operation, see FIG. 5. The model of the observer corresponds to the model last used in the first step, that is to say, it may possibly be relinearized every 15 minutes. The correction term $L(yP-\hat{y})$ now uses the PMU measured values yP so as to maintain the observer state $\hat{x}$ close to the state of the real power supply system. Finally, the fault signal $e=yP-\hat{y}$ is formed and compared with the patterns in the fault pattern database (pattern recognition 4).

An alternative embodiment does not require a fault database or power supply system simulator at all. Here an observer 5 is operated, as in FIG. 5, with PMU measured values as input variables. In addition, further observers are operated, as in FIG. 5, with PMU measured values as input variables, but these observers differ in that each observer is "calibrated" to a specific fault. If, for example, the parameter p=p0 describes the fault-free model and the parameters p=p1, p=p2 and p=p3 describe three different faults, four observers are run in parallel, one each with the parameters p0, p1, p2, p3. In the fault-free case, the fault signal $e0=yP-\hat{y}0$ converges to zero. If the fault has occurred with the associated parameter p1, however, e0 does not converge to zero, and instead the fault signal $e1=yP-\hat{y}1$. The same applies for the other two faults. This makes it easy to identify the faults. With this embodiment, however, the derivation of effective countermeasures must be undertaken in a different way.

An essential inventive step is the recognition that the combination of simulator, observer and pattern recognition facilitates the separation of different fault patterns. Herein also lies a major advantage of the invention. In the previous method, the nominal (fault-free) system behavior and the faulty behavior are superimposed in the fault patterns. With the new method, the observer separates the nominal system behavior from the faulty behavior. This facilitates the pattern recognition.

Extensions of the method can be used for assistance systems for power supply system operators, who in critical situations propose suitable countermeasures to the operator, or carry them out automatically.

The invention claimed is:

1. A method for generating at least one fault pattern for identifying one or more faults in a power supply system, the method comprising:
   generating at least one first pattern corresponding to a fault-functioning state of the power supply system using a power supply system simulator, the generating at least one first pattern including simulating phasor measurement unit (PMU) values at various times for the fault-functioning state of the power supply system;
   generating at least one second pattern corresponding to a fault-free state of the power supply system using an observer, the generating at least one second pattern including simulating PMU values at various times for the fault-free state of the power supply system;
   generating the at least one fault pattern for identifying one or more faults by forming differences between the at least one first pattern and the at least one second pattern; and
   storing, in a non-transitory memory, the at least one fault pattern for identifying one or more faults, the at least one fault pattern for identifying one or more faults being assigned to at least one fault from among the one or more faults.

2. The method of claim 1, wherein
   the non-transitory memory includes a database storing values of the at least one fault pattern, and
   an assignment of the at least one fault pattern is stored in the database.

3. The method of claim 1, further comprising:
   assigning at least one of the at least one fault pattern to at least one measure countering a respective associated fault, and
   storing the assignment in the non-transitory memory.

4. The method of claim 1, wherein the PMU values include currents and voltages of the power supply system.

5. A method for identifying a fault in a power supply system, the method comprising:
   measuring phasor measurement units (PMU) values specific to the power supply system during operation of the power supply system;

generating at least one third pattern from the PMU values measured at various times; and comparing the at least one third pattern with the at least one fault pattern generated in accordance with the method of claim 1.

6. A system for generation of at least one fault pattern for identifying one or more faults in a power supply system, the system comprising:

a power supply system simulator configured to generate at least one first pattern corresponding to a fault-functioning state of the power supply system based on simulating phasor measurement unit (PMU) values at various times for the fault-functioning state of the power supply system;

an observer configured to generate at least one second pattern corresponding to a fault-free state of the power supply system based on simulating PMU values at various times for the fault-free state of the power supply system; and a non-transitory memory, configured to store at least one fault pattern for identifying one or more faults, the at least one fault pattern generated by forming differences between the at least one first pattern and the at least one second pattern, and the at least one fault pattern being assigned to at least one fault from among the one or more faults.

7. The system of claim 6, wherein the non-transitory memory includes a database storing values for the at least one fault pattern.

8. A non-transitory computer-readable medium storing a computer-readable program that, when executed on a computer, causes the computer to perform the method of claim 1.

* * * * *